United States Patent
Kuwabara

(10) Patent No.: US 8,648,536 B2
(45) Date of Patent: Feb. 11, 2014

(54) PLASMA LIGHT SOURCE

(75) Inventor: Hajime Kuwabara, Tokyo (JP)

(73) Assignee: IHI Corporation, Tokyo (JP)

( * ) Notice: Subject to any disclaimer, the term of this patent is extended or adjusted under 35 U.S.C. 154(b) by 0 days.

(21) Appl. No.: 13/390,361

(22) PCT Filed: Aug. 31, 2010

(86) PCT No.: PCT/JP2010/064757
§ 371 (c)(1),
(2), (4) Date: Feb. 14, 2012

(87) PCT Pub. No.: WO2011/027737
PCT Pub. Date: Mar. 10, 2011

(65) Prior Publication Data
US 2012/0146511 A1    Jun. 14, 2012

(30) Foreign Application Priority Data

Sep. 1, 2009  (JP) .................................. 2009-201835
Sep. 1, 2009  (JP) .................................. 2009-201836

(51) Int. Cl.
H01J 7/24 (2006.01)
(52) U.S. Cl.
USPC ............ 315/111.71; 315/111.21; 315/111.41; 315/111.51; 315/111.61; 315/111.31
(58) Field of Classification Search
USPC ............ 315/111.71, 111.61, 111.51, 111.41, 315/111.31, 111.21
See application file for complete search history.

(56) References Cited

U.S. PATENT DOCUMENTS

| 4,778,130 A | 10/1988 | Kim |
| 4,817,892 A | 4/1989 | Janeke |
| 4,934,632 A | 6/1990 | Kim |
| 5,763,930 A | 6/1998 | Partlo |

(Continued)

FOREIGN PATENT DOCUMENTS

| EP | 1 298 965 A2 | 4/2003 |
| JP | 62-176038 A | 8/1987 |

(Continued)

OTHER PUBLICATIONS

Sailaja et al. ("Efficient Absorption and Intense Soft X-Ray Emission From Gas Cluster Plasmas Irradiated by 25-ps Laser Pulses", IEEE Transactions on Plasma Science, vol. 33, No. 3, Jun. 2005, pp. 1006-1012,2005).

(Continued)

*Primary Examiner* — Daniel Cavallari
*Assistant Examiner* — Srinivas Sathiraju
(74) *Attorney, Agent, or Firm* — Griffin & Szipl, P.C.

(57) ABSTRACT

A pair of coaxial electrodes 10 that face each other, a discharge-environment-maintaining device 20, and a voltage-applying device 30 are provided. Each coaxial electrode 10 includes a center electrode 12, a guide electrode 14 which surrounds the front end portion of the facing center electrode, and an insulation member 16 which insulates the center electrode and the guide electrode from each other. The insulation member 16 is formed of partially porous ceramics including an insulative dense portion 16a and a porous portion 16b. The insulative dense portion 16a includes a reservoir 18 which holds a plasma medium therein, and by the porous portion 16b, the inner surface of the reservoir 18 communicates with a gap between the center electrode 12 and the guide electrode 14 through the inside of the insulative dense portion 16a.

7 Claims, 5 Drawing Sheets

(56) References Cited

U.S. PATENT DOCUMENTS

| | | | |
|---|---|---|---|
| 5,963,616 A | 10/1999 | Silfvast et al. | |
| 6,002,744 A | 12/1999 | Hertz et al. | |
| 6,133,577 A | 10/2000 | Gutowski et al. | |
| 6,194,733 B1 | 2/2001 | Haas et al. | |
| 6,232,613 B1* | 5/2001 | Silfvast et al. | 250/504 R |
| 6,262,826 B1 | 7/2001 | Shafer | |
| 6,438,199 B1 | 8/2002 | Schultz et al. | |
| 6,452,194 B2 | 9/2002 | Bijkerk et al. | |
| 6,469,310 B1 | 10/2002 | Fiedorowicz et al. | |
| 6,507,641 B1 | 1/2003 | Kondo et al. | |
| 6,541,786 B1* | 4/2003 | Partlo et al. | 250/504 R |
| 6,711,233 B2 | 3/2004 | Hertz et al. | |
| 6,714,624 B2 | 3/2004 | Fornaciari et al. | |
| 6,924,600 B2 | 8/2005 | Mochizuki | |
| 6,965,117 B2 | 11/2005 | Hiramoto | |
| 6,998,785 B1* | 2/2006 | Silfvast et al. | 315/111.71 |
| 7,328,885 B2 | 2/2008 | Schuermann et al. | |
| 7,365,350 B2 | 4/2008 | Tran et al. | |
| 7,414,253 B2* | 8/2008 | Kleinschmidt et al. | 250/504 R |
| 7,473,907 B2 | 1/2009 | Singer et al. | |
| 7,598,508 B2 | 10/2009 | Sogard | |
| 7,691,755 B2 | 4/2010 | Li et al. | |
| 7,709,816 B2 | 5/2010 | Bakshi et al. | |
| 2001/0004104 A1 | 6/2001 | Bijkerk et al. | |
| 2002/0051358 A1 | 5/2002 | Haas et al. | |
| 2003/0053588 A1 | 3/2003 | Kondo et al. | |
| 2003/0053594 A1 | 3/2003 | Fornaciari et al. | |
| 2004/0155207 A1 | 8/2004 | Kleinschmidt | |
| 2005/0205810 A1 | 9/2005 | Akins et al. | |
| 2005/0274897 A1 | 12/2005 | Singer et al. | |
| 2006/0158126 A1 | 7/2006 | Schuermann et al. | |
| 2006/0226377 A1 | 10/2006 | Hergenhan et al. | |
| 2006/0243927 A1 | 11/2006 | Tran et al. | |
| 2007/0002516 A1 | 1/2007 | Matsumoto | |
| 2007/0012889 A1 | 1/2007 | Sogard | |
| 2007/0045573 A1 | 3/2007 | Kleinschmidt et al. | |
| 2007/0228298 A1 | 10/2007 | Komori et al. | |
| 2008/0083887 A1 | 4/2008 | Komori et al. | |
| 2008/0237497 A1 | 10/2008 | Huggins et al. | |
| 2008/0283779 A1 | 11/2008 | Tran et al. | |
| 2008/0286982 A1 | 11/2008 | Li et al. | |
| 2008/0302652 A1 | 12/2008 | Entley et al. | |
| 2009/0091273 A1 | 4/2009 | Horioka et al. | |
| 2009/0218521 A1 | 9/2009 | Sogard et al. | |

FOREIGN PATENT DOCUMENTS

| | | |
|---|---|---|
| JP | 01-243349 A | 9/1989 |
| JP | 2000-509190 A | 7/2000 |
| JP | 2001-215721 A | 8/2001 |
| JP | 2001-511311 A | 8/2001 |
| JP | 2002-544675 A | 12/2002 |
| JP | 2003-51398 A | 2/2003 |
| JP | 2003-282424 A | 10/2003 |
| JP | 2004-226244 A | 8/2004 |
| JP | 2005-32510 A | 2/2005 |
| JP | 2006-294606 A | 10/2006 |
| JP | 2007-502000 A | 2/2007 |
| JP | 2007-207574 A | 8/2007 |
| JP | 2007-273239 A | 10/2007 |
| JP | 2007-529869 A | 10/2007 |
| JP | 2007-317598 A | 12/2007 |
| JP | 2007-329484 A | 12/2007 |
| JP | 2008-300351 A | 12/2008 |
| TW | 200903574 A | 1/2009 |
| TW | 200908815 A | 2/2009 |
| TW | 200915396 A | 4/2009 |
| WO | 2006/035748 A1 | 4/2006 |
| WO | 2006-120942 A1 | 11/2006 |

OTHER PUBLICATIONS

Office Action issued in co-pending related U.S. Appl. No. 13/388,165 on Nov. 9, 2012.

Sato et al., "Discharge-Producted Plasma EUV Source for Microlithography", OQD-08-28.

Jeroen Jonkers, "High power extreme ultra-violet (EUV) light sources for future lithography", Plasma Sources Science and Technology, 15 (2006) S8-S16.

Search Report issued in International Application No. PCT/JP2010/064757, completed Sep. 17, 2010 and mailed Oct. 5, 2010.

Search Report issued in International Application No. PCT/JP2010/064557, completed Sep. 29, 2010 and mailed Oct. 12, 2010.

Search Report issued in International Application No. PCT/JP2010/064386, completed Nov. 9, 2010 and mailed Nov. 22, 2010.

Office Action issued in co-pending related U.S. Appl. No. 13/388,165 on Jun. 13, 2013.

Office Action issued in corresponding Korean application 10-2012-7004074 on May 28, 2013.

Office Action issued in co-pending related U.S. Appl. No. 13/384,899 on Aug. 12, 2013.

Office Action issued in corresponding Taiwanese application 99129421 on Jul. 19, 2013.

Extended European Search Report issued in related application 10813648.2, completed Dec. 10, 2013 and mailed Dec. 18, 2013.

\* cited by examiner

PLASMA LIGHT SOURCE

This is a National Phase Application in the United States of International Patent Application No. PCT/JP2010/064757 filed Aug. 31, 2010, which claims priority on Japanese Patent Application No. 2009-201835, filed Sep. 1, 2009 and Japanese Patent Application No. 2009-201836, filed Sep. 1, 2009. The entire disclosures of the above patent applications are hereby incorporated by reference.

TECHNICAL FIELD

The present invention relates to a plasma light source for EUV (Extreme ultraviolet) radiation.

BACKGROUND ART

Lithography which uses an extreme ultraviolet light source for the microfabrication of next-generation semiconductors has been expected. Lithography is a technique which reduces and projects light or beams onto a silicon substrate through a mask having a circuit pattern drawn thereon and which forms an electronic circuit by exposing a resist material. The minimal processing dimensions of the circuit formed by optical lithography are basically dependent on the wavelength of the light source. Accordingly, the wavelength of the light source used for the development of next-generation semiconductors needs to be shortened, and thus a study for the development of such a light source has been conducted.

Extreme ultraviolet (EUV) is most expected as the next-generation lithography light source, and the light has a wavelength in the range of approximately 1 to 100 nm. Since the light of the range has high absorptivity with respect to all materials, and a transmissive optical system such as a lens cannot be used, a reflective optical system is used. Further, it is very difficult to develop the optical system of the EUV light range, and this optical system exhibits reflection characteristics only for a restricted wavelength.

Currently, a Mo/Si multilayer film reflection mirror with sensitivity of 13.5 nm has been developed. Then, by developing lithography techniques obtained by the combination of the light of this wavelength and the reflection mirror, it is expected that processing dimensions of 30 nm or less may be realized. In order to realize a new microfabrication technique, there is an immediate need for the development of a lithography light source with a wavelength of 13.5 nm, and radiant light from plasma with high energy density has gained attention.

The generation of light source plasma may be largely classified into laser produced plasma (LPP) using the radiation of laser and discharge produced plasma (DPP) using the discharge of a gas and driven by the pulse power technique. In DPP, the input power is directly converted into plasma energy. For this reason, the DPP has better energy converting efficiency than that of the LPP, and has an advantage in that the device is small and cheap.

The radiation spectrum from hot and highly dense plasma using the DPP is basically determined by the temperature and the density of the target material. According to the calculation result for the atomic process of the plasma, in order to obtain plasma of the EUV radiation range, the electron temperature and the electron density are respectively optimized as about several 10 eV and $10^{18}$ cm$^{-3}$ in the case of Xe and Sn, and are respectively optimized as about 20 eV and $10^{18}$ cm$^{-3}$ in the case of Li.

Furthermore, the plasma light source is disclosed in Non-Patent Documents 1 and 2 and Patent Document 1.

PRIOR ART DOCUMENTS

Non-Patent Documents

[Non-Patent Document 1]
Hiroto Sato and others, "Discharge-Produced Plasma EUV Source for Microlithography", OQD-08-28
[Non-Patent Document 2]
Jeroen Jonkers, "High power extreme ultra-violet (EUV) light sources for future lithography", Plasma Sources Science and Technology, 15(2006) S8-S16
Patent Documents
[Patent Document 1]
Japanese Patent Application Laid-Open No. 2004-226244, "Extreme ultra-violet light source and semiconductor exposure apparatus"

SUMMARY OF THE INVENTION

Problems to be Solved by the Invention

Regarding the EUV lithography light source, there is a demand for the average output to be high, the size of the light source to be minute, the amount of the scattering particles (debris) to be small, and the like. At present, the EUV emitting amount is extremely low compared to the output demand, and an increase in output is a major challenge to be overcome. However, when the input energy is set to be large to obtain a high output, damage caused by the thermal load reduces the life span of the plasma generating device or the optical system. Accordingly, in order to meet both high EUV output and low thermal load, high energy converting efficiency is essentially needed.

At the beginning of forming plasma, a great deal of energy is consumed for heating or ionization, and hot and highly dense plasma radiating EUV is generally expanded rapidly. For this reason, the radiation sustaining time T is extremely short. Accordingly, in order to improve the converting efficiency, it is important to maintain the plasma in a hot temperature and a highly dense state appropriate for EUV radiation for a long period of time (in an order of μsec).

A solid medium such as Sn or Li at a room temperature has a high spectrum converting efficiency, but a change in phase such as melting and evaporation occurs with the generation of plasma. For this reason, the inside of the device may be greatly contaminated by debris (derivatives produced with the discharge) such as neutral particles. Therefore, there is a similar demand for the reinforcement of a system which supplies and collects the target.

Currently, the radiation time of the general EUV plasma light source is about 100 nsec, so that the output is extremely insufficient. In order to obtain both high converting efficiency and high average output for the industrial application, there is a need to attain an EUV radiation time of several μsec for one shot. That is, in order to develop a plasma light source with high converting efficiency, there is a need to maintain plasma in a temperature-and-density state appropriate for the target for several μsec (at least 1 μsec or more) to attain the stable EUV radiation.

In addition, in a capillary discharge of the related art, since the plasma is confined inside the capillary, there is a disadvantage in that the effective radiation solid angle is small.

Therefore, it is an object of the invention to provide a plasma light source which stably generates plasma light for EUV radiation for a long period of time (in an order of μsec), which suffers little damage due to the thermal load of the component, and which obtains a large effective radiation solid angle of the plasma light.

Means for Solving the Problems

In order to attain the above-described object, according to a first invention, there is provided a plasma light source comprising:

a pair of coaxial electrodes that face each other;

a discharge-environment-maintaining device that maintains a plasma medium inside the coaxial electrodes at a temperature and a pressure appropriate for the generation of plasma; and a voltage-applying device that applies discharge voltages having reversed polarities to the respective coaxial electrodes, wherein a tubular discharge is formed between the pair of coaxial electrodes so as to confine the plasma in the axial direction, wherein each of the respective coaxial electrodes includes a rod-shaped center electrode that extends on a single axis, a guide electrode that surrounds the facing front end portion of the center electrode with a predetermined gap therebetween, and an insulation member that insulates the center electrode and the guide electrode from each other, wherein the insulation member is formed of partially porous ceramics that include an insulative dense portion which does not permit the continuous permeation of the liquefied plasma medium and a porous portion which permits the continuous permeation of the liquefied plasma medium, and wherein the insulative dense portion includes a reservoir that holds the plasma medium therein, and by the porous portion, the inner surface of the reservoir communicates with the gap between the center electrode and the guide electrode, through the inside of the insulative dense portion.

According to the preferred embodiments of the first invention, the plasma light source further includes a temperature-adjustable heating device that heats the insulation member so as to liquefy the plasma medium therein.

According to the preferred embodiments of the first invention, the plasma light source further includes a gas-supply device that supplies an inert gas into the reservoir, and a pressure-adjusting device that adjusts a supply pressure of the inert gas.

In order to attain the above-described object, according to a second invention, there is provided a plasma light source comprising:

a pair of coaxial electrodes that face each other;

a discharge-environment-maintaining device that maintains a plasma medium inside the coaxial electrodes at a temperature and a pressure appropriate for the generation of plasma; and a voltage-applying device that applies discharge voltages having reversed polarities to the respective coaxial electrodes, wherein a tubular discharge is formed between the pair of coaxial electrodes so as to confine the plasma in the axial direction, wherein each of the respective coaxial electrodes includes a rod-shaped center electrode that extends on a single axis, a guide electrode that surrounds the facing front end portion of the center electrode with a predetermined gap therebetween, and an insulation member that insulates the center electrode and the guide electrode from each other, wherein the insulation member is formed of porous ceramics that has a front surface positioned at the side of the front end portion of the center electrode and has a rear surface at the opposite side thereof, and wherein the plasma light source further comprises:

a hollow reservoir that is opened to the rear surface of the insulation member and holds the plasma medium therein;

a gas-supply device that supplies an inert gas into the reservoir;

a pressure-adjusting device that adjusts a supply pressure of the inert gas; and a temperature-adjustable heating device that heats and liquefies the plasma medium inside the reservoir.

According to the preferred embodiments of the first or second invention, the voltage-applying device may include a positive voltage source that applies a positive discharge voltage which is higher than that of the guide electrode of one of the coaxial electrodes, to the center electrode of the one of the coaxial electrodes, a negative voltage source that applies a negative discharge voltage which is lower than that of the guide electrode of the other of the coaxial electrodes, to the center electrode of the other of the coaxial electrodes, and a trigger switch that causes the positive voltage source and the negative voltage source to simultaneously apply the discharge voltages to the respective coaxial electrodes.

Advantageous Effect of the Invention

According to the device of the first and second inventions, the pair of facing coaxial electrodes are provided, the planar discharge current (the planar discharge) is generated in each of the pair of coaxial electrodes, a single plasma is formed at the middle position between the respective facing coaxial electrodes by the planar discharges, and then the planar discharges are connected to form the tubular discharge between the pair of coaxial electrodes so as to generate the magnetic field (the magnetic bottle) which confines the plasma, thereby stably generating the plasma light for EUV radiation for a long period of time (in an order of μsec).

Further, since the single plasma is formed at the middle position between the pair of facing coaxial electrodes, and the energy converting efficiency may be improved to a great extent compared to a capillary discharge or a vacuum discharge metal plasma of the related art, the thermal load of each electrode is reduced during the formation of plasma, so that damage caused by the thermal load of the component may be remarkably reduced.

Further, since the plasma which is the light emitting source of the plasma light is formed at the middle position between the pair of facing coaxial electrodes, the effective radiation solid angle of the generated plasma light may be made large.

DESCRIPTION OF EMBODIMENTS

Figure 1:
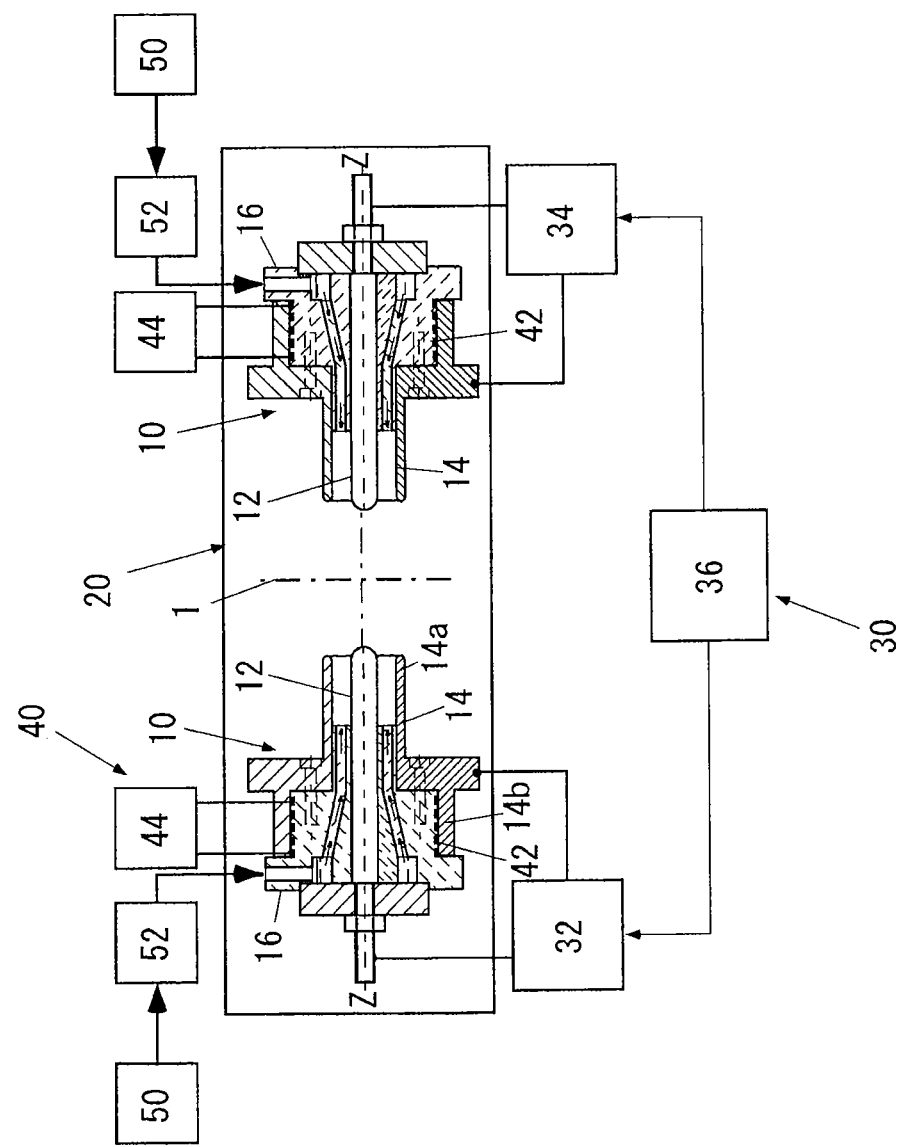
FIG. 1 is a diagram showing a first embodiment of a plasma light source according to the invention.

Hereinafter, exemplary embodiments of the invention will be described on the basis of the accompanying drawings. Furthermore, the same reference numerals will be given to common parts in the respective drawings, and repetitive description thereof will be omitted.

FIG. 1 is a diagram showing a first embodiment of a plasma light source according to the invention.

In this drawing, a plasma light source according to a first embodiment of the invention includes a pair of coaxial electrodes 10, a discharge-environment-maintaining device 20, a voltage-applying device 30, and a heating device 40.

The pair of coaxial electrodes 10 are arranged so as to face each other with respect to a symmetry plane 1.

Each coaxial electrode 10 includes a rod-shaped center electrode 12, a guide electrode 14, and an insulation member 16.

The rod-shaped center electrode 12 is a conductive electrode which extends on a single axis Z-Z.

In this example, the end surface of the center electrode 12 facing the symmetry plane 1 has a circular-arc shape. Furthermore, this structure is not essential, and a recessed portion may be formed in the end surface so as to stabilize a planar discharge current 2 and a tubular discharge 4 to be described later, or the end surface may be a plane.

The guide electrode 14 surrounds the facing front end portion of the center electrode 12 with a predetermined gap therebetween, and holds a plasma medium therebetween. The guide electrode 14 includes, in this example, a small diameter hollow cylindrical portion 14a which is positioned at the side of the symmetry plane 1, and a large diameter hollow portion 14b which is positioned at the opposite side thereof and has a larger diameter than that of the small diameter hollow cylindrical portion 14a. Further, the end surface of the small diameter hollow cylindrical portion 14a facing the symmetry plane 1 in the guide electrode 14 has a circular-arc shape in this example, but may have a plane shape.

In this example, the plasma medium may be a solid plasma medium such as Sn and Li at a room temperature.

The insulation member 16 is an electrical insulator which is positioned between the center electrode 12 and the guide electrode 14, and has a hollow cylindrical shape, and electrically insulates the center electrode 12 and the guide electrode 14 from each other. The insulation member 16 is formed of porous ceramics having a front surface positioned at the side of the front end portion of the center electrode 12 and a rear surface positioned at the opposite side thereof.

In this example, the insulation member 16 includes a small diameter portion which is fitted into the inside of the small diameter hollow cylindrical portion 14a, and a large diameter portion which is fitted into the inside of the large diameter hollow portion 14b. The large diameter portion is integrally connected to the guide electrode 14 by a bolt 17 (refer to FIG. 2).

In the above-described pair of coaxial electrodes 10, the respective center electrodes 12 are positioned on the same axis Z-Z, and are positioned so as to be symmetry to each other with a predetermined gap therebetween.

The discharge-environment-maintaining device 20 maintains the coaxial electrode 10 to be in a state where the plasma medium inside the coaxial electrode 10 has a temperature and a pressure appropriate for the generation of plasma.

The discharge-environment-maintaining device 20 may include, for example, a vacuum chamber, a temperature controller, a vacuum device, and a plasma medium supply device. Furthermore, this structure is not essential, and the other structures may be used.

The voltage-applying device 30 applies a discharge voltage having reversed polarities to the respective coaxial electrodes 10.

The voltage-applying device 30 includes, in this example, a positive voltage source 32, a negative voltage source 34, and a trigger switch 36.

The positive voltage source 32 applies a positive discharge voltage, which is higher than that of the guide electrode 14 of one of the coaxial electrodes 10 (in this example, the left electrode 10), to the center electrode 12 of the same coaxial electrode 10.

The negative voltage source 34 applies a negative discharge voltage, which is lower than that of the guide electrode 14 of the other of the coaxial electrodes 10 (in this example, the right electrode 10), to the center electrode 12 of the same coaxial electrode 10.

The trigger switch 36 simultaneously applies positive and negative discharge voltage to the respective coaxial electrodes 10 by simultaneously activating the positive voltage source 32 and the negative voltage source 34.

With this structure, the plasma light source according to the first embodiment of the invention is configured to confine plasma in the axial direction by forming a tubular discharge (described later) between the pair of coaxial electrodes 10.

The heating device 40 includes an electric heater 42 which heats the insulation member 16, and a heating power supply 44 which supplies heating power to the electric heater 42. The heating device 40 heats the insulation member 16 so as to liquefy the plasma medium therein. Especially, the heating device 40 heats and liquefies the plasma medium inside a reservoir 18 described later by heating the insulation member 16.

In this example, the electric heater 42 is arranged in a groove formed in the outer periphery of the large diameter portion of the insulation member 16. In this example, the electric heater 42 receives power from the heating power supply 44 through a power supply line which penetrates the large diameter hollow portion 14b of the guide electrode 14. Further, the electric heater 42 includes a temperature sensor (not shown) to heat the insulation member 16 and maintain the insulation member 16 at a predetermined temperature.

Figure 2:
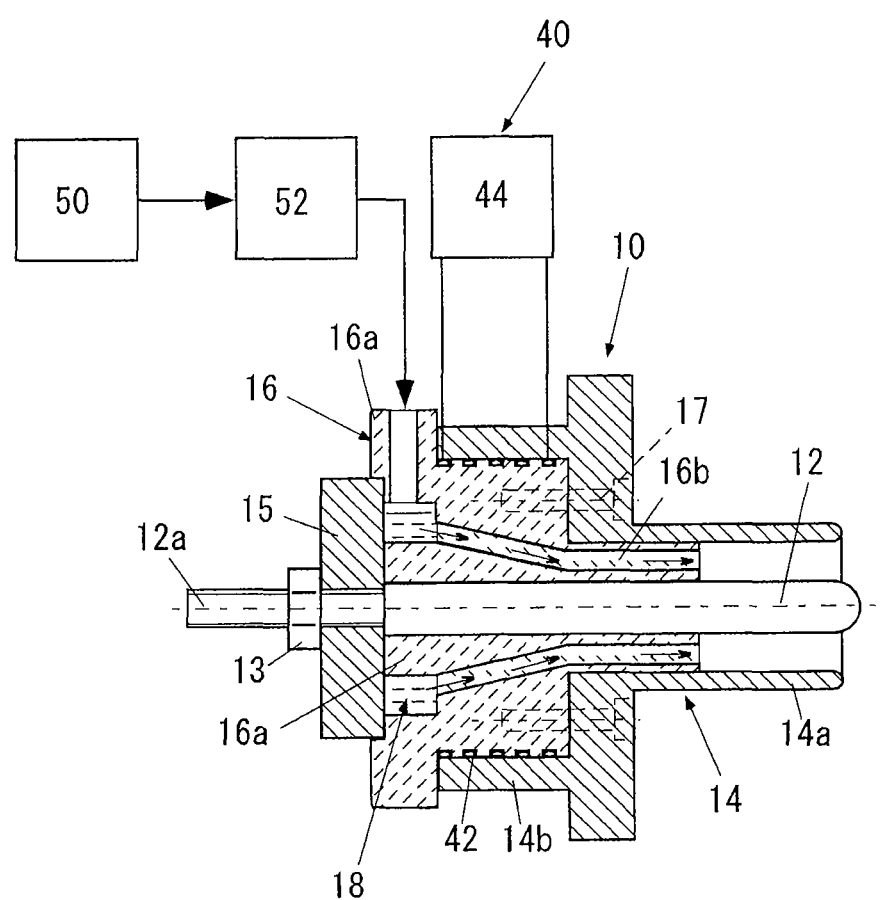
FIG. 2 is an enlarged view of a coaxial electrode of FIG. 1.

FIG. 2 is an enlarged view of the coaxial electrode of FIG. 1.

In this drawing, the insulation member 16 is formed of partially porous ceramics obtained by integrally molding an insulative dense portion and a porous portion such that the liquefied plasma medium does not continuously permeate the insulative dense portion 16a, but continuously permeates the porous portion 16b.

The insulative dense portion 16a insulates the center electrode 12 and the guide electrode 14 from each other.

Further, in this example, the porous portion 16b continuously extends from the rear surface of the insulation member 16 to the front surface thereof through the inside of the insulative dense portion 16a.

Preferably, ceramics forming the insulative dense portion 16a and the porous portion 16b is insulative ceramics such as alumina ($Al_2O_3$), aluminum nitride (AlN), zirconia (ZrO), and silicon carbide (SiC).

Further, the particle diameter and the burning temperature of the insulative dense portion 16a are set so that the liquefied plasma medium does not continuously permeate the insulative dense portion 16a. Moreover, the particle diameter and the burning temperature of the porous portion 16b are set so that the liquefied plasma medium continuously permeate the insulative dense portion 16a.

Further, the insulative dense portion 16a includes the reservoir 18 which holds the plasma medium therein. In this example, the reservoir 18 is a cylindrical cavity which is provided inside the insulative dense portion 16a and which centers the axis Z-Z.

Furthermore, in this example, the reservoir 18 is opened to the rear surface of the insulation member 16, and the rear surface (the left side of the drawing) of the reservoir 18 is closed by a closing plate 15. The closing plate 15 is attachably and detachably fixed by the nut 13 into which a screw shaft 12a provided at the rear surface side of the center electrode 12 is screwed. The closing plate 15 may be formed of a heat-resistant metal plate or heat-resistant ceramics which withstands the temperature of the liquefied plasma medium.

With this structure, the reservoir 18 may be appropriately replenished with the plasma medium by the attachment and detachment of the closing plate 15. Further, in this example, the plasma medium inside the reservoir 18 is Sn, Li, or the like, and is liquefied by the heating device 40.

The plasma light source of FIG. 1 further includes a gas-supply device 50 and a pressure-adjusting device 52.

The gas-supply device 50 supplies an inert gas into the reservoir 18. It is desirable that the inert gas be a rare gas such as argon and xenon.

The pressure-adjusting device 52 is installed at an intermediate position in the gas supply line of the gas-supply device 50 so as to adjust the supply pressure of the inert gas.

Furthermore, in the first embodiment, the gas-supply device 50 and the pressure-adjusting device 52 may be omitted.

By using the above-described plasma light source, the insulation member 16 is heated and maintained at a temperature at which the vapor pressure of the plasma medium 6 (Sn, Li, and the like) becomes a pressure (in an order of Torr) appropriate for the generation of plasma, and the inside of the coaxial electrode 10 (the gap between the center electrode 12 and the guide electrode 14) is made to be a vapor atmosphere of the plasma medium 6 having a pressure in an order of Torr.

Further, the electrode conductors (the center electrode 12 and the guide electrode 14) are maintained at a high temperature at which the vapor of the plasma medium 6 does not aggregate.

The plasma medium 6 may be made to flow out in a liquid metal state from the surface (the end surface) of the porous portion 16b of the insulation member 16 to the inside of the coaxial electrode 10 (the gap between the center electrode 12 and the guide electrode 14).

Instead, the plasma medium 6 may be supplied as a metal vapor gas from the surface (the end surface) of the porous portion 16b of the insulation member 16 to the inside of the coaxial electrode 10 (the gap between the center electrode 12 and the guide electrode 14). In this case, the heating device 40 liquefies the plasma medium 6 inside the reservoir 18, and vaporizes the liquefied plasma medium 6 so as to be changed into a metal vapor gas. Furthermore, in order to supply the plasma medium 6 as a metal vapor gas from the surface (the end surface) of the porous portion 16b to the inside of the coaxial electrode 10, it is desirable that the insulative dense portion 16b be formed such that a gas cannot pass through the insulative dense portion 16b.

Furthermore, the shapes of the insulative dense portion 16a and the porous portion 16b are not limited to this example, and may be other shapes as long as the center electrode 12 and the guide electrode 14 are electrically insulated from each other.

Figure 3A:
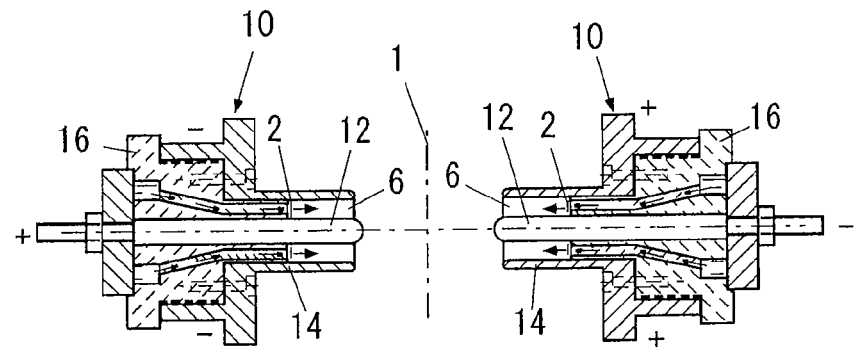
FIG. 3A is a diagram illustrating the operation of the plasma light source of the first embodiment of the invention, and shows the state where a planar discharge is generated.
Figure 3B:
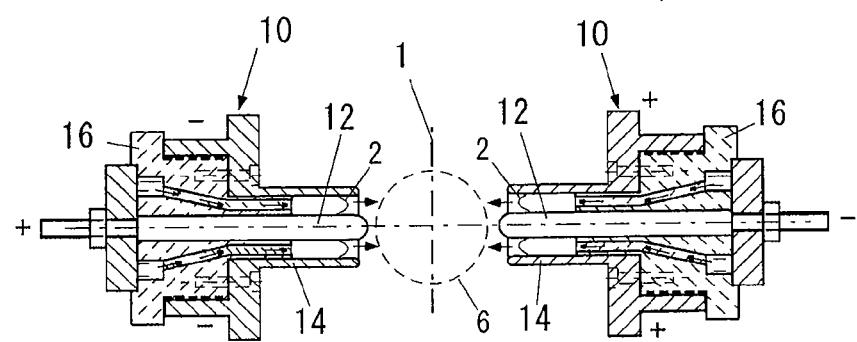
FIG. 3B is a diagram illustrating the operation of the plasma light source of the first embodiment of the invention, and shows the state where the planar discharge moves.
Figure 3C:
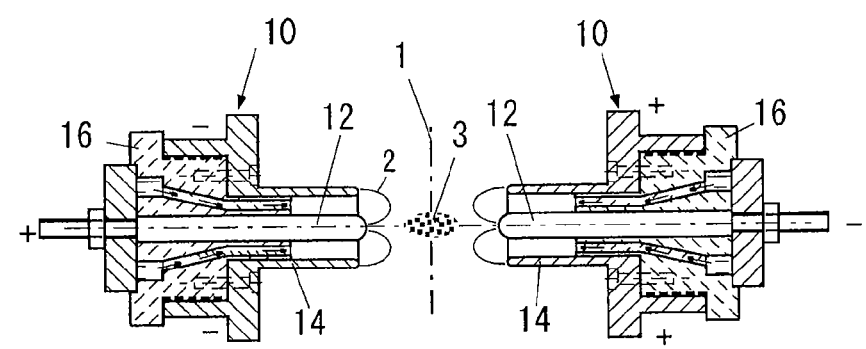
FIG. 3C is a diagram illustrating the operation of the plasma light source of the first embodiment of the invention, and shows the state where a plasma is formed.
Figure 3D:
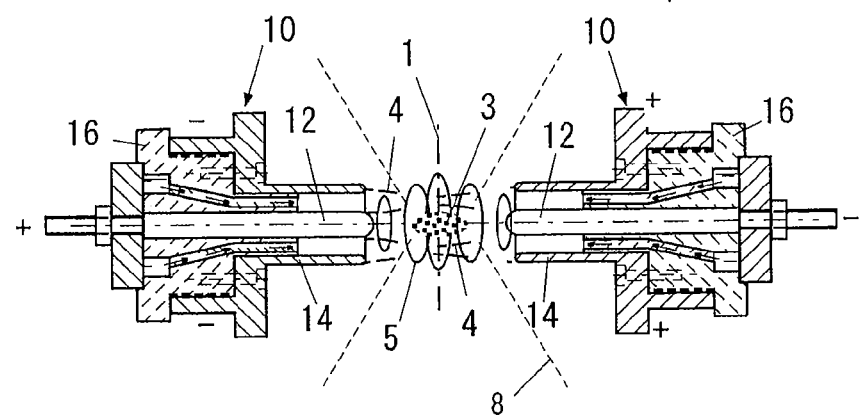
FIG. 3D is a diagram illustrating the operation of the plasma light source of the first embodiment of the invention, and shows the state where a plasma-confining magnetic field is formed.

FIGS. 3A to 3D are diagrams illustrating the operation of the plasma light source of FIG. 1. FIG. 3A shows the state where the planar discharge is generated, FIG. 3B shows the state where the planar discharge moves, FIG. 3C shows the state where the plasma is formed, and FIG. 3D shows the state where the plasma-confining magnetic field is formed.

Hereinafter, referring to these drawings, a method of generating plasma light using the device of the first embodiment of the invention will be described.

In the plasma light source according to the first embodiment of the invention, the above-described pair of coaxial electrodes 10 are disposed so as to face each other, the plasma medium is supplied to the insides of the coaxial electrodes 10 by the discharge-environment-maintaining device 20 so as to be maintained at a temperature and a pressure appropriate for the generation of plasma, and discharge voltages having reversed polarities are applied to the respective coaxial electrodes 10 by the voltage-applying device 30.

As shown in FIG. 3A, due to the application of voltages, a planar discharge current (hereinafter, referred to as a planar discharge 2) is generated in the surfaces of the insulation members 16 of the pair of coaxial electrodes 10. The planar discharge 2 is a planar discharge current which is spread two-dimensionally, and is referred to as "a current sheet" hereinafter.

In addition, at this time, a positive voltage (+) is applied to the center electrode 12 of the left coaxial electrode 10, a negative voltage (−) is applied to the guide electrode 14, a negative voltage (−) is applied to the center electrode 12 of the right coaxial electrode 10, and a positive voltage (+) is applied to the guide electrode 14.

Furthermore, both guide electrodes 14 may be grounded so as to be maintained at 0 V, a positive voltage (+) may be applied to one center electrode 12, and a negative voltage (−) may be applied to the other center electrode 12.

As shown in FIG. 3B, the planar discharge 2 moves in the direction (the direction toward the center of the drawing) of being discharged from the electrode by the self magnetic field.

As shown in FIG. 3C, when the planar discharge 2 reaches the front ends of the pair of coaxial electrodes 10, the plasma medium 6 which is interposed between the pair of planar discharges 2 is changed to have a high density and a high temperature, so that a single plasma 3 is formed at the middle position (the symmetry plane 1 of the center electrode 12) between the facing coaxial electrodes 10.

Further, in this state, the pair of facing center electrodes 12 are respectively held at a positive voltage (+) and a negative voltage (−), and the pair of facing guide electrodes 14 are respectively held at a positive voltage (+) and a negative voltage (−). Accordingly, as shown in FIG. 3D, the planar discharges 2 of the pair of facing center electrodes 12 may be connected to each other to form the tubular discharge 4 discharged between the pair of facing guide electrodes 14. Here, the tubular discharge 4 indicates a hollow cylindrical discharge current which surrounds the axis Z-Z.

When the tubular discharge 4 is formed, a plasma-confining magnetic field (a magnetic bottle) which is indicated by the reference numeral 5 is formed so as to confine the plasma 3 in the radial direction and the axial direction.

That is, when the magnetic bottle 5 is formed in a shape of which the center portion is large and both sides are small due to the pressure of the plasma 3, an axial magnetic pressure gradient toward the plasma 3 is formed, and the plasma 3 is confined at the middle position by the magnetic pressure gradient. Moreover, the plasma 3 is compressed (Z-pinched) toward the center by the self magnetic field of the plasma current, so that it is also confined in the radial direction by the self magnetic field.

In this state, the energy corresponding to the light emitting energy of the plasma 3 is continuously supplied from the voltage-applying device 30, so that it is possible to stably generate the plasma light 8 (EUV) with a high energy converting efficiency for a long period of time.

Figure 4:
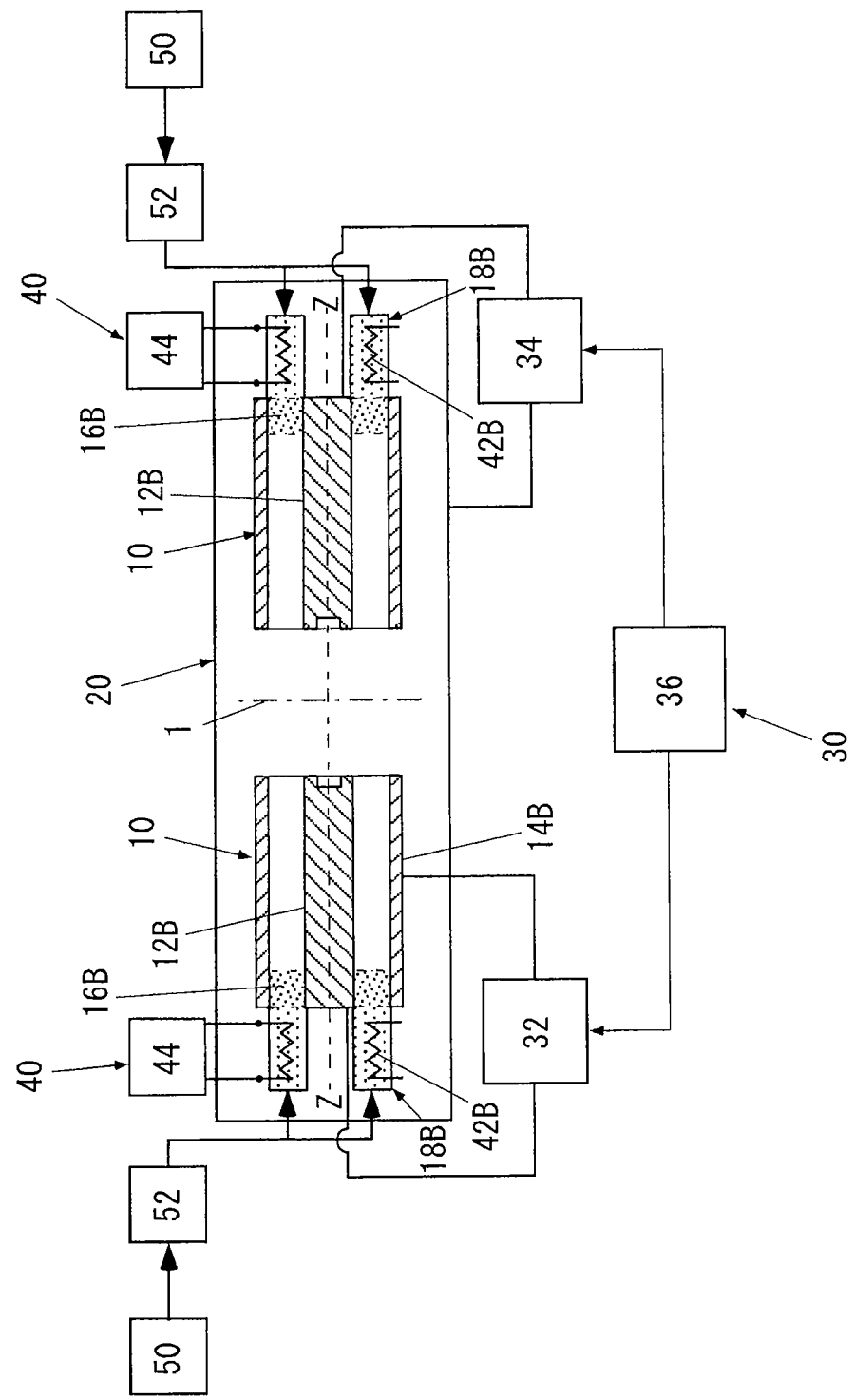
FIG. 4 is a diagram showing a second embodiment of a plasma light source according to the invention.
Figure 5:
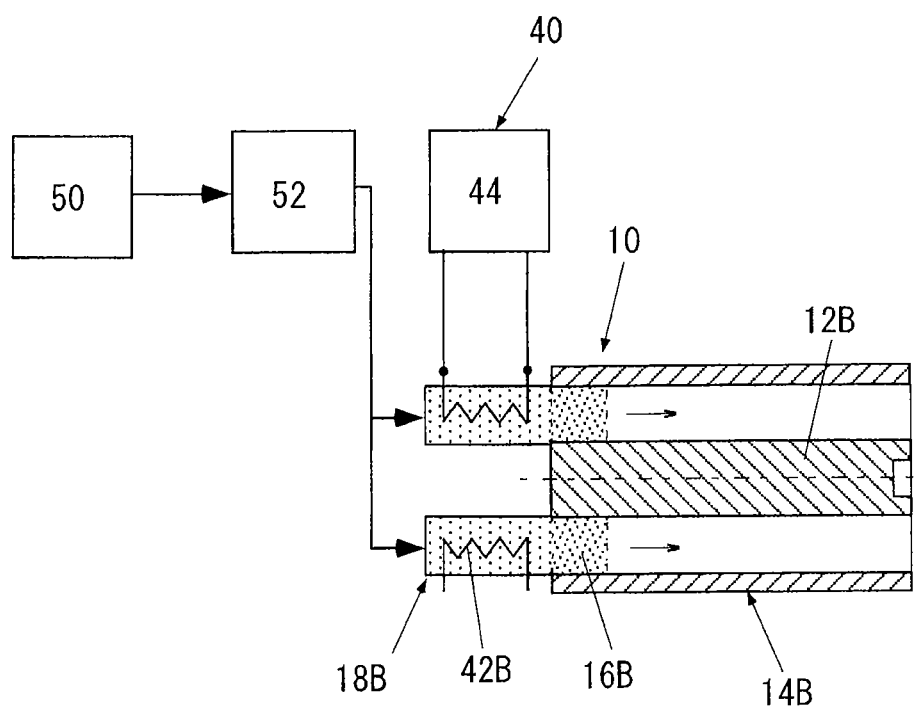
FIG. 5 is an enlarged view of a coaxial electrode of FIG. 4.

FIG. 4 is a diagram showing a second embodiment of a plasma light source according to the invention, and FIG. 5 is an enlarged view of the coaxial electrode of FIG. 4.

In the second embodiment, a center electrode 12B, a guide electrode 14B, an insulation member 16B, a reservoir 18B, and an electric heater 42B are respectively provided instead of the center electrode 12, the guide electrode 14, the insulation member 16, the reservoir 18, and the electric heater 42 of the first embodiment.

In FIGS. 4 and 5, each coaxial electrode 10 includes a rod-shaped center electrode 12B, a tubular guide electrode 14B, and a ring-shaped insulation member 16B.

The ring-shaped insulation member 16B is an electrical insulator which is positioned between the center electrode 12B and the guide electrode 14B, and has a hollow cylindrical shape, and electrically insulates the center electrode 12B and the guide electrode 14B from each other. In this example, the ring-shaped insulation member 16B is formed of porous ceramics.

Further, the plasma light source of FIG. 4 further includes a hollow reservoir 18B which is opened to the rear surface of the insulation member 16B and which holds the plasma medium therein.

Moreover, the heating device 40 includes, in this example, an electric heater 42B which heats the reservoir 18B, and a heating power supply 44 which supplies heating power to the electric heater 42B. The heating device 40 heats and liquefies the plasma medium inside the reservoir 18B.

The other structures of the second embodiment are the same as those of the first embodiment. However, in the second embodiment, the gas-supply device 50 and the pressure-adjusting device 52 are not omitted.

According to the device of the above-described first or second embodiment of the invention, the pair of facing coaxial electrodes 10 are provided, the planar discharge current (the planar discharge 2) is generated in each of the pair of coaxial electrodes 10, the single plasma 3 is formed at the middle position between the respective facing coaxial electrodes 10 by the planar discharges 2, and then the planar discharges 2 are connected to form the tubular discharge 4 between the pair of coaxial electrodes so as to generate the plasma-confining magnetic field 5 (the magnetic bottle 5) which confines the plasma 3, thereby stably generating the plasma light for EUV radiation for a long period of time (in an order of μsec).

Further, since the single plasma 3 is formed at the middle position between the pair of facing coaxial electrodes 10, and the energy converting efficiency is improved to a great extent (ten times or more) compared to a capillary discharge or a vacuum discharge metal plasma of the related art, the thermal load of each electrode is reduced during the formation of plasma, so that damage caused by the thermal load of the component may be remarkably reduced.

Further, since the plasma 3 which is the light emitting source of the plasma light is formed at the middle position between the pair of facing coaxial electrodes 10, the effective radiation solid angle of the plasma light can be made large.

Moreover, in the first embodiment of the invention, the insulation member 16 is formed of the partially porous ceramics obtained by integrally molding the insulative dense portion 16a and the porous portion 16b, the insulative dense portion 16a is provided with the reservoir 18 which holds the plasma medium therein, and by the porous portion 16b, the inner surface of the reservoir 18 communicates with the gap between the center electrode 12 and the guide electrode 14, through the inside of the insulative dense portion 16a. Accordingly, due to the presence of the insulative dense portion 16a, the insulation in the coaxial electrode may be maintained even when a liquid metal as a plasma medium flows through the porous portion 16b, whereby the plasma medium may be continuously supplied between the center electrode 12 and the guide electrode 14.

Furthermore, it is desirable that the insulation member 16 be obtained by integrally molding the insulative dense portion 16a and the porous portion 16b in consideration of the structure of the device. However, the insulative dense portion 16a and the porous portion 16b may be bonded to each other (by adhering, brazing, or the like), or a seal structure is provided to prevent the plasma medium from leaking from a clearance between the insulative dense portion 16a and the porous portion 16b.

Moreover, in the first embodiment or the second embodiment of the invention, there are provided the hollow reservoir 18 or 18B which is opened to the rear surface of the insulation member 16 or 16B and which holds the plasma medium therein, the gas-supply device 50 which supplies the inert gas into the reservoir 18 or 18B, the pressure-adjusting device 52 which adjusts the supply pressure of the inert gas, and the temperature-adjustable heating device 40 which heats and liquefies the plasma medium inside the reservoir 18 or 18B. Accordingly, it is possible to control the vapor pressure of the plasma medium at the front surface of the insulation member 16 or 16B through the temperature adjustment of the heating device 40. Further, at the same time, it is possible to control the supply amount of the plasma medium (the liquid metal) by adjusting the pressure of the inert gas to be supplied into the reservoir 18 or 18B by the gas-supply device 50 and the pressure-adjusting device 52.

Therefore, it is possible to continuously supply the plasma medium, supply the plasma medium at the sufficient supply speed, and independently control the supply amount and the vapor pressure of the plasma medium.

Furthermore, it should be understood that the invention is not limited to the above-described embodiments and all modifications may be included in the scope of the appended claims or the equivalents thereof.

Description Of Reference Numerals
   1: SYMMETRY PLANE
   2: PLANAR DISCHARGE (CURRENT SHEET)
   3: PLASMA
   4: TUBULAR DISCHARGE
   5: PLASMA-CONFINING MAGNETIC FIELD
   6: PLASMA MEDIUM
   8: PLASMA LIGHT (EUV)
   10: COAXIAL ELECTRODE
   12, 12B: CENTER ELECTRODE
   12a: SCREW SHAFT
   13: NUT 14, 14B: GUIDE ELECTRODE
15: CLOSING PLATE
16, 16B: INSULATION MEMBER (PARTIALLY POROUS CERAMICS)
16a: INSULATIVE DENSE PORTION
16b: POROUS PORTION
18, 18B: RESERVOIR
20: DISCHARGE-ENVIRONMENT-MAINTAINING DEVICE
30: VOLTAGE-APPLYING DEVICE
32: POSITIVE VOLTAGE SOURCE
34: NEGATIVE VOLTAGE SOURCE
36: TRIGGER SWITCH
40: HEATING DEVICE
42, 42B: ELECTRIC HEATER
44: HEATING POWER SUPPLY

The invention claimed is:

1. A plasma light source comprising:
(a) a pair of coaxial electrodes that are arranged to face each other with respect to a symmetry plane, wherein each of the respective coaxial electrodes includes
   (i) a rod-shaped center electrode that extends on a single axis Z-Z,
   (ii) a guide electrode that surrounds a facing front end portion of the center electrode and has a predetermined gap between the guide electrode and the center electrode, and
   (iii) an insulation member that insulates the center electrode and the guide electrode from each other,
wherein the symmetry plane is perpendicular to the axis Z-Z;
(b) a discharge-environment-maintaining device that maintains a plasma medium inside the coaxial electrodes at a temperature and a pressure appropriate for the generation of plasma; and
(c) a voltage-applying device that applies discharge voltages having reversed polarities to the respective coaxial electrodes;
wherein a tubular discharge is formed between the pair of coaxial electrodes so as to confine the plasma in an axial Z-Z direction,
wherein the insulation member is formed of partially porous ceramics that include an insulative dense portion that does not permit the continuous permeation of the liquefied plasma medium and a porous portion that permits the continuous permeation of the liquefied plasma medium, and
wherein the insulative dense portion includes a reservoir that holds the plasma medium therein, and by the porous portion, the inner surface of the reservoir communicates with the gap between the center electrode and the guide electrode, through the inside of the insulative dense portion.

2. The plasma light source according to claim 1, further comprising:
(d) a temperature-adjustable heating device that heats the insulation member so as to liquefy the plasma medium therein.

3. The plasma light source according to claim 1, further comprising:
(d) a gas-supply device that supplies an inert gas into the reservoir; and
(e) a pressure-adjusting device that adjusts a supply pressure of the inert gas.

4. A plasma light source comprising:
(a) a pair of coaxial electrodes that face each other with respect to a symmetry plane, wherein each of the respective coaxial electrodes includes
   (i) a rod-shaped center electrode that extends on a single axis Z-Z,
   (ii) a guide electrode that surrounds a facing front end portion of the center electrode that has a predetermined gap between the guide electrode and the center electrode, and
   (iii) an insulation member that insulates the center electrode and the guide electrode from each other,
wherein the symmetry plane is perpendicular to the axis Z-Z;
(b) a discharge-environment-maintaining device that maintains a plasma medium inside the coaxial electrodes at a temperature and a pressure appropriate for the generation of plasma;
(c) a voltage-applying device that applies discharge voltages having reversed polarities to the respective coaxial electrodes;
(d) a hollow reservoir that is opened to the rear surface of the insulation member and holds the plasma medium therein;
(e) a gas-supply device that supplies an inert gas into the reservoir;
(f) a pressure-adjusting device that adjusts a supply pressure of the inert gas; and
(g) a temperature-adjustable heating device that heats and liquefies the plasma medium inside the reservoir;
wherein a tubular discharge is formed between the pair of coaxial electrodes so as to confine the plasma in an axial Z-Z direction,
wherein the insulation member is formed of porous ceramics that has a front surface positioned at the side of the front end portion of the center electrode and has a rear surface at the opposite side thereof, and.

5. The plasma light source according to claim 1,
wherein the voltage-applying device includes
   (i) a positive voltage source that applies a positive discharge voltage that is higher than that of the guide electrode of one of the coaxial electrodes, to the center electrode of the one of the coaxial electrodes,
   (ii) a negative voltage source that applies a negative discharge voltage which is lower than that of the guide electrode of the other of the coaxial electrodes, to the center electrode of the other of the coaxial electrodes, and
   (iii) a trigger switch that causes the positive voltage source and the negative voltage source to simultaneously apply the discharge voltages to the respective coaxial electrodes.

6. The plasma light source according to claim 4,
wherein the voltage-applying device includes
   (i) a positive voltage source that applies a positive discharge voltage that is higher than that of the guide electrode of one of the coaxial electrodes, to the center electrode of the one of the coaxial electrodes,
   (ii) a negative voltage source that applies a negative discharge voltage which is lower than that of the guide electrode of the other of the coaxial electrodes, to the center electrode of the other of the coaxial electrodes, and
   (iii) a trigger switch that causes the positive voltage source and the negative voltage source to simultaneously apply the discharge voltages to the respective coaxial electrodes.

7. The plasma light source according to claim 2, further comprising:
 (e) a gas-supply device that supplies an inert gas into the reservoir; and
 (f) a pressure-adjusting device that adjusts a supply pressure of the inert gas.

\* \* \* \* \*